United States Patent
Jeong et al.

(10) Patent No.: US 6,914,010 B2
(45) Date of Patent: Jul. 5, 2005

(54) PLASMA ETCHING METHOD

(75) Inventors: Jae Young Jeong, Cueonan-kun (KR); Takashi Fuse, Tokyo (JP); Kiwami Fujimoto, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 7 days.

(21) Appl. No.: 10/745,519

(22) Filed: Dec. 29, 2003

(65) Prior Publication Data

US 2004/0137747 A1 Jul. 15, 2004

(30) Foreign Application Priority Data

Dec. 26, 2002 (JP) .......................................... 2002-377299
Nov. 25, 2003 (JP) .......................................... 2003-393792

(51) Int. Cl.[7] ...................... H01L 21/302; H01L 21/461
(52) U.S. Cl. ........................ 438/733; 438/756; 438/757
(58) Field of Search .............................. 438/733, 734, 438/735, 736, 738, 739, 740, 743, 744, 756, 757, 714, 723, 724, 725, 689, 513, 514

(56) References Cited

U.S. PATENT DOCUMENTS

| 6,025,115 | A | * | 2/2000 | Komatsu et al. | 430/313 |
| 6,342,428 | B1 | * | 1/2002 | Zheng et al. | 438/424 |
| 6,753,263 | B1 | * | 6/2004 | Ito et al. | 438/714 |

* cited by examiner

*Primary Examiner*—David Nhu
(74) *Attorney, Agent, or Firm*—Oblon, Spivak, McClelland, Maier & Neustadt, P.C.

(57) ABSTRACT

A plasma etching method is performed by plasma etching an SiN layer through a mask layer to form a first wiring portion and a second wiring portion, the first and the second wiring portions having different wiring densities in the etched SiN layer, the mask having two pattern portions respectively corresponding to the first and the second wiring portions. In the plasma etching step, by using an etching gas including fluorocarbon and $C_2H_2F_4$, the line width variation between the first and the second wiring portions is restrained.

14 Claims, 6 Drawing Sheets

$CF_4 + C_2H_2F_4 + Ar + O_2$ | ETCHING

COMPACT WIRING PORTION

LOOSE WIRING PORTION

COMPACT WIRING PORTION

LOOSE WIRING PORTION

PLASMA ETCHING METHOD

FIELD OF THE INVENTION

The present invention relates to a plasma etching method for use in a manufacturing process of semiconductor devices.

BACKGROUND OF THE INVENTION

Conventionally, a gaseous mixture of $CF_4$, $CHF_3$, $O_2$ and Ar is used as an etching gas to plasma etch SiN (silicon nitride) layer and $SiO_2$ (silicon oxide) layer, (see, e.g., Japanese Patent Laid-open Publication No. 1998-321597).

However, in case of plasma etching the SiN layer and the $SiO_2$ layer by a gaseous mixture of $CF_4$, $CHF_3$, $O_2$ and Ar via a mask to form a compact wiring portion and a loose wiring portion in the SiN layer and the $SiO_2$ layer, a line width of wiring at the compact wiring portion and that at the loose wiring portion formed in the SiN layer and the $SiO_2$ layer after etching become different, wherein the mask has a dense pattern portion corresponding to the compact wiring portion where the wiring of a desired target line width is arranged densely and a sparse pattern portion corresponding to the loose wiring portion where the wiring of a desired target line width is arranged sparsely. Moreover, such line widths are in a wide-range distribution, further exacerbating the problem of line width variations between the compact and the loose wiring portions after etching.

In general, a plurality of cells are arranged in a mesh pattern on the entire surface of the silicon wafer, wherein each cell is made up of a circuit pattern including the aforementioned compact wiring portion and loose wiring portion. Therefore, when etching is executed by a gaseous mixture of $CF_4$, $CHF_3$, $O_2$ and Ar on such wafer, there occurs, for instance, the problem of an in-surface variation where the line width of a wiring at the compact wiring portion located in a center portion of the silicon wafer becomes different from that at a peripheral portion thereof.

The line width is becoming smaller due to a recent trend of miniaturization and high-integration of semiconductor devices. In order to fulfill such requirement of smaller line width, the line width of a wiring formed in an etched SiN layer and/or $SiO_2$ layer may need to be made smaller than the line width of a pattern of a corresponding mask layer. In other words, the width of an opening formed in the etched layer may be made larger than that in the mask layer. Such etching is called trimming. During such a trimming process, the process conditions need to be adjusted to obtain a desired line width of a wiring in the etched layer. In the trimming process, it is required to prevent the occurrence of line width variations between a compact and a loose wiring portions and the in-surface variation.

SUMMARY OF THE INVENTION

It is, therefore, an object of the present invention to provide a plasma etching method capable of suppressing line width variations between a compact and a loose wiring portions and an in-surface variation.

It is another object of the present invention to provide a plasma etching method capable of controlling the line width of a wiring formed in an etched layer.

In accordance with a preferred embodiment of the present invention, there is provided a plasma etching method including the step of: plasma etching an SiN layer through a mask layer to form a first wiring portion and a second wiring portion, the first and the second wiring portions having different wiring densities in the etched SiN layer, the mask having two pattern portions respectively corresponding to the first and the second wiring portions, wherein the plasma etching step is carried out by using an etching gas having fluorocarbon and $C_2H_2F_4$ to restrain a line width variation between the first and the second wiring portions.

In accordance with another preferred embodiment of the present invention, there is provided a plasma etching method including the step of: plasma etching an $SiO_2$ layer through a mask layer to form a first wiring portion and a second wiring portion having different wiring densities in the etched $SiO_2$ layer, the mask having two pattern portions respectively corresponding to the first and the second wiring portions, wherein the plasma etching step is carried out by using an etching gas having fluorocarbon, $C_2H_2F_4$ and $O_2$ to restrain line width variations between the first and the second wiring portions.

In accordance with a further preferred embodiment of the present invention, there is provided a plasma etching method including the step of: plasma etching an $SiO_2$ layer or an SiN layer through a mask layer by using an etching gas having fluorocarbon, $C_2H_2F_4$ and $O_2$ to form a wiring in the $SiO_2$ layer or the SiN layer, the mask being formed of an organic material and having a mask pattern corresponding to the wiring, wherein the line width of the wiring is smaller than that of the mask pattern and the difference therebetween is determined by an ambient pressure or the flow rate of said $O_2$ in the etching gas during the plasma etching step.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Preferred embodiments of the present invention will now be described in detail with reference to the accompanying drawings.

Figure 1:
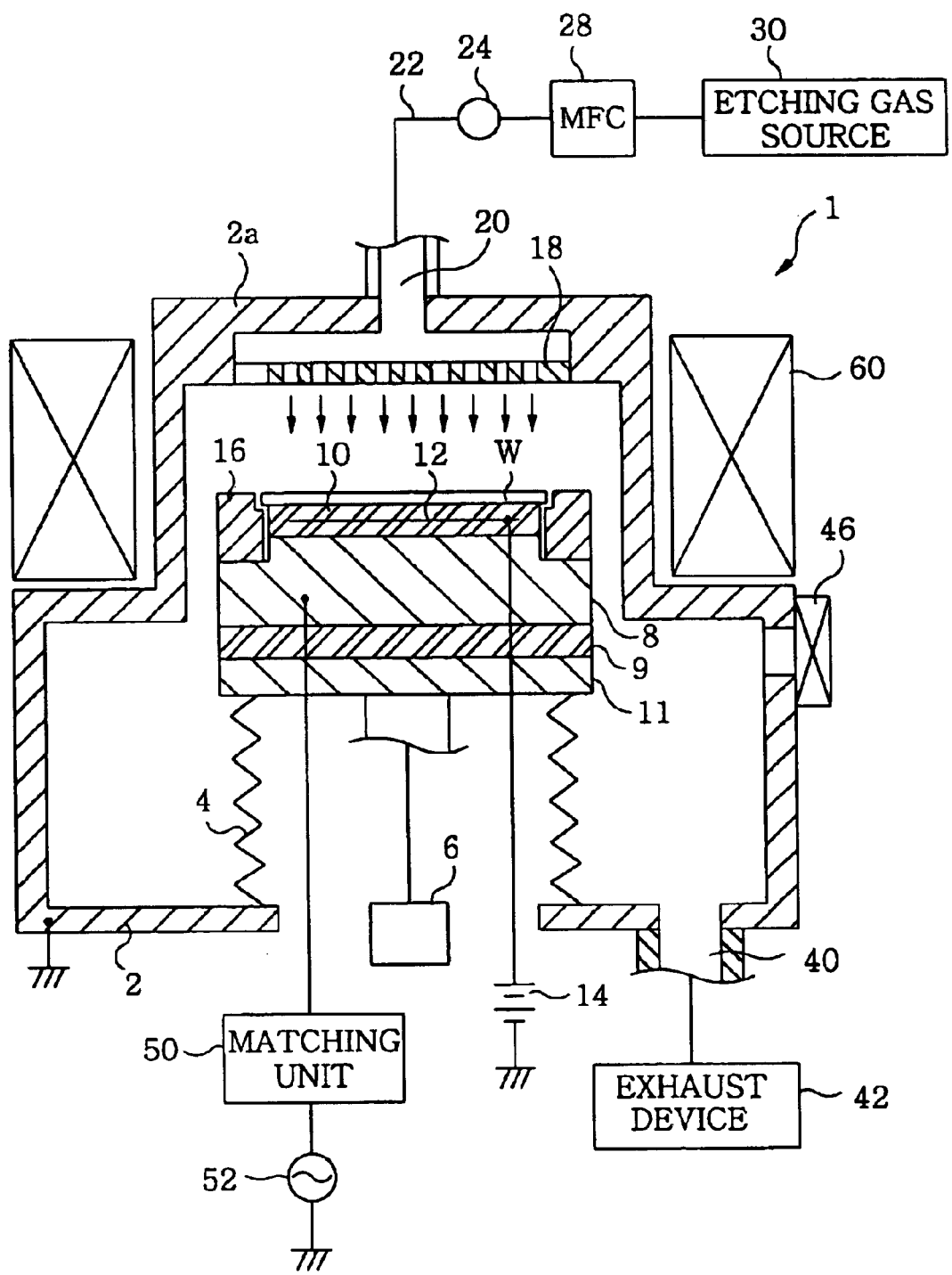
FIG. 1 is a schematic cross-sectional view of a plasma etching device.

FIG. 1 is a cross-sectional view of a plasma etching device 1 for use in carrying out the present invention.

A grounded chamber 2 is made of a metal, e.g., aluminum with oxidized surface. An elevation mechanism 6 surrounded by an electrically conductive bellows 4 is placed at a lower part of the chamber 2 and a conductor 11, an insulator 9 and a susceptor 8 are placed thereon that order from the bottom. The susceptor 8 functions as a lower electrode of parallel plate electrodes. The conductor 11 is grounded through the bellows 4, and the susceptor 8 and the conductor 11 are electrically insulated by the insulator 9. A high frequency power supply 52 is connected to the susceptor 8 through a matching unit 50.

On the susceptor 8 is installed an electrostatic chuck 10 on which an object to be processed such as a semiconductor wafer W is mounted. The electrostatic chuck 10 is composed of an electrode 12 embedded in an insulator, wherein the electrode 12 is connected to a DC power supply 14 which applies a DC voltage, enabling the electrostatic chuck 10 to electrostatically adsorb the object W. A focus ring 16 is placed in a cir circumferential periphery of an upper surface of the susceptor 8, to surround the object W. Further, the focus ring 16 is made of Si, $SiO_2$ or the like, and improves a uniformity of etching.

Furthermore, placed above the susceptor 8 is an upper electrode plate 18 facing the susceptor 8. The upper electrode plate 18 is fixed on ceiling 2a of the chamber 2. That is, the ceiling 2a, the upper electrode plate 18 and a side wall of the chamber 2 function as an upper electrode of the parallel plate electrodes.

A gas inlet is placed at an upper portion of the ceiling 2a of the chamber 2. Connected to the gas inlet 20 is a gas supply line 22 which is linked to a valve 24, a MFC (mass flow controller) 28 and an etching gas source 30. The etching gas source 30 supplies, e.g., $CF_4$, $C_2H_2F_4$, $O_2$, Ar, etc. Etching gas supplied inside the chamber 2 almost uniformly effuses on the object W through holes in the upper electrode plate 18.

Connected to a bottom portion of the chamber 2 is an exhaust line 40 which is linked up with an exhaust device 42. Further, a sidewall of the chamber 2 is equipped with a gate valve 46, wherein the object W is conveyed between the chamber 2 and a neighboring loadlock chamber (not shown) while the gate valve 46 is open.

A dipole ring magnet 60 is arranged outside the chamber 2 around the plasma processing area. The dipole ring magnet 60 includes a plurality of anisotropic segment columnar magnets arranged in a ring shape, creating a substantially uniform horizontal magnetic field on the whole by deviating magnetizing directions of the anisotropic segment columnar magnet from each other. The dipole ring magnet 60 makes an orthogonal electromagnetic field in the plasma processing area, and the resultant drift of electrons causes a high energy magnetron discharge, thereby creating a high density plasma. By rotating the dipole ring magnet 60, a uniform magnetic field can be created.

Figure 2A:
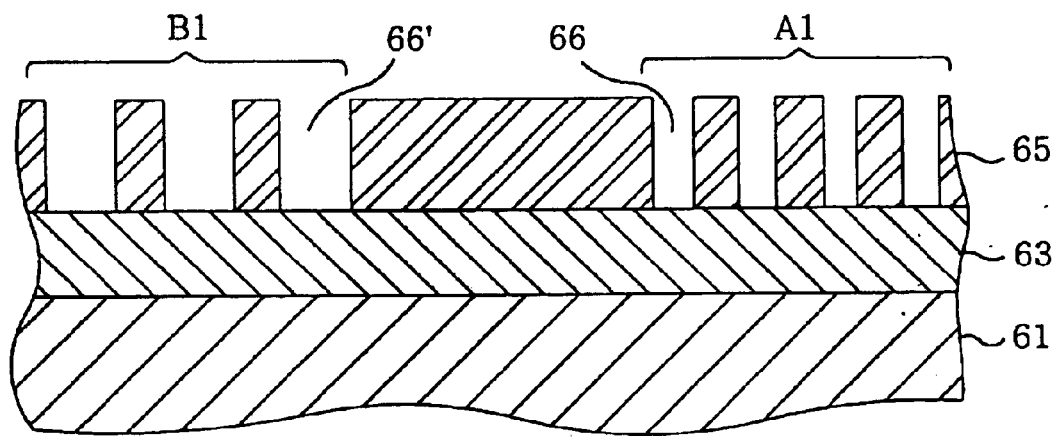
FIGS. 2A and 2B show cross-sectional views of an etching target layer of an object to be processed before and after an etching process.

Hereinafter, an etching process of the object W using the above plasma etching device 1 will now be described in detail, wherein the object W includes a WSi layer 61, an etching target layer 63 formed of an SiN layer coating the WSi layer 61, and a photoresist (mask) layer 65 coating the etching target layer 63 as illustrated in FIG. 2A. In order to form a compact wiring portion A2 where a wiring 67 of a desired target line width is arranged densely and a loose wiring portion B2 where a wiring 67' of the desired target line width (the line width of the wiring 67' is set to be identical to that of the wirings 67) is arranged sparsely in the etching layer 63 via etching, that is, to form two different wirings having different wiring densities, the photoresist layer 65 includes a dense pattern portion A1 corresponding to the compact wiring portion A2 and a sparse pattern portion B1 corresponding to the loose wiring portion B2.

Further, a portion where a ratio of a distance between neighboring lines of wirings (i.e., a width of an opening) to a line width of the wiring is smaller than 3 is defined as the "compact wiring portion", and a portion where the ratio is equal to or greater than 3 is defined as the "loose wiring portion". A width of an opening 66 at the dense pattern portion A1 and a width of an openeing 66' at the sparse pattern portion B1 of the photoresist layer 65 are set to have desired values to produce corresponding patterns of the compact wiring portion A2 and the loose wiring portion B2, respectively.

The object W is conveyed into the chamber 2 and placed on the electrostatic chuck 10, upon lowering the susceptor 8 by the elevation mechanism 6, and opening the gate valve 46. Next, the gate valve 46 is closed and the susceptor 8 is elevated to a processing position. After the chamber 2 is depressurized by the exhaust device 42, the valve 24 is opened, to enable the etching gas source 30 to supply a gas including fluorocarbon and $C_2H_2F_4$, e.g., an etching gas composed of $CF_4$, $C_2H_2F_4$, $O_2$ and Ar. The inner pressure of the chamber 2 is maintained at a preset level, e.g., 13.3 Pa (100 mTorr).

By rotating the dipole ring magnet 60 and applying a high frequency power to the susceptor 8 under the condition, a plasma of the etching gas is produced and the SiN layer 63 is etched via the photoresist layer 65. In the meantime, before or after applying the high frequency power, a DC voltage is applied from the DC power supply 14 to the electrode 12 inside the electrostatic chuck 10 to thereby electrostatically adsorb the object W thereon. During the etching process, a certain luminous intensity is detected by an endpoint detector (not shown) and the etching process is terminated in response thereto.

By etching the etching target layer 63 formed of the SiN layer using the etching gas including fluorocarbon and $C_2H_2F_4$ in a manner described above, the line width variation between the wiring 67 at the compact wiring portion A2 formed in the etching target layer 63 via the dense pattern portion A1 of the photoresist layer 65 and the wiring 67' at the loose wiring portion B2 formed in the etching target layer 63 via the sparse pattern portion B1 can be reduced or suppressed.

Adding Ar to the etching gas and using $CF_4$ as a fluorocarbon can improve anisotropy of etching. And by adding $O_2$ to the etching gas and setting up the etching ambient pressure (i.e., the chamber pressure) or $O_2$ flow rate at a predetermined value, the line width of the wiring 67 at the compact wiring portion A2 and that of the wiring 67' at the loose wiring portion B2 after etching can be controlled.

Figure 3:
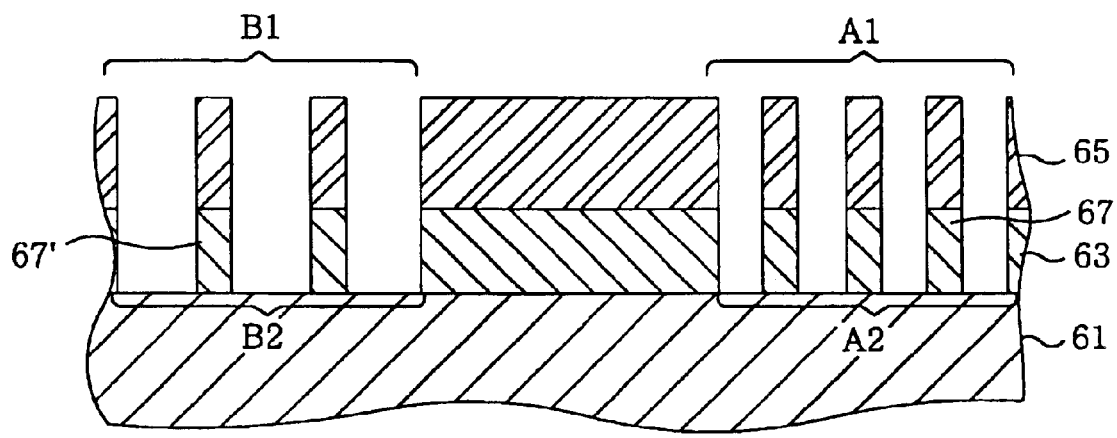
FIG. 3 illustrates the etching target layer of FIG. 2A after being subjected to a trimming process.

By setting either one of the chamber pressure and $O_2$ flow rate high, the etching widens widths of the openings 66 and 66' of the photoresist layer 65. Therefore, as shown schematically in FIG. 3, a distance between neighboring lines of the wirings 67 at the compact wiring portion A2 becomes wider than that of the opening 66 at the dense pattern portion A1 of the photoresist layer 65 before etching. Similarly, a distance between neighboring lines of the wirings 67' at the loose wiring portion B2 becomes wider than that of the opening 66' at the sparse pattern portion B1 of the photoresist layer 65 before etching. That is, the so-called trimming can be done in which line widths of the wirings 67 and 67' at the compact and the loose wiring portion A2 and B2 are narrowed. Further, by setting both of the chamber pressure and $O_2$ flow rate high, the line widths of the wirings 67 and 67' at the compact and the loose wiring portion A2 and B2 can be made finer.

In plasma etching the etching target layer 63 formed of SiN, it is preferable to maintain the chamber pressure at about 10 Pa (75 mTorr) to about 27 Pa (200 mTorr). Under such setting, etching rate and a selectivity with respect to the photoresist layer 65 can be raised. Furthermore, it is preferable that the $O_2$ flow rate is established at about 10 sccm to about 20 sccm, wherein the $O_2$ flow rate less than 10 sccm raises the in-surface variation of the object W that greater than 20 sccm deteriorates the selectivity with respect to the photoresist layer 65.

An object to be processed having an $SiO_2$ layer as a substitute for the SiN layer of the etching target layer 63 can still be plasma etched in a manner described above. In this case, by using an etching gas including fluorocarbon, $C_2H_2F_4$ and $O_2$, the line width variation between the wiring at the compact wiring portion formed in the $SiO_2$ layer via the dense pattern portion A1 of the photoresist layer 65 and that at the loose wiring portion formed via the sparse pattern portion B1 can be reduced or restrained to be small. Further, the etching anisotropy can also be improved by adding Ar to the etching gas and using $CF_4$ as fluorocarbon in etching the $SiO_2$ layer. And by setting the chamber pressure and $O_2$ flow rate at certain levels, the line width of the wiring formed in the $SiO_2$ layer can be controlled.

After removing the photoresist layer 65, the etching target layer 63 formed of the $SiO_2$ layer or the SiN layer, which has the wiring line width regulated by the above etching process, can be used as a hard mask layer to etch an underlying layer thereof.

The plasma etching device of the present invention is not limited to the above-described magnetron discharge device. An inductively coupled plasma etching device, a parallel plate plasma etching device operating with plural high frequency powers, and the like can also be used in the plasma etching of the present invention.

EXAMPLES

First, the object to be processed W (the etching target layer 63 being formed of SiN) shown in FIG. 2A was plasma etched under a following condition. The etching gas was a mixture gas of $CF_4$, $C_2H_2F_4$, $O_2$ and Ar; a frequency of the high frequency power supply 52 was 13.56 MHz; the high frequency power supplied to the susceptor 8 ranged from 200 to 700 W; and a pressure inside the chamber 2 during etching was 5.3 Pa (40 mTorr) to 27 Pa (200 mTorr). Further, flow rates of $CF_4$, $C_2H_2F_4$ and Ar of the etching gas were 65 sccm, 5 sccm and 400 sccm; and an $O_2$ flow rate was varied from 10 to 20 sccm.

The shape of the openings 66 and 66' respectively formed at the dense and the sparse pattern portion A1 and B1 of the photoresist layer 65 was of a generally rectangular shape which has a much greater length than a width thereof, in order to form such shaped wirings 67 and 67' at the compact and the loose wiring portion A2 and B2 of the etching target layer 63, respectively. In order to achieve a target line width of 90 nm both in the wirings 67 and 67' at the compact and the loose wiring portion A2 and B2, the width of the opening 66 at the dense pattern portion A1 was set at 90 nm and that of the opening 66' at the sparse pattern portion B1 was set at 270 nm. Further, such compact and loose wiring pattern was disposed in a rectangular cell of a predetermined size, and a plurality of such cells was arranged in a meshlike pattern on the entire object W.

Figure 2B:
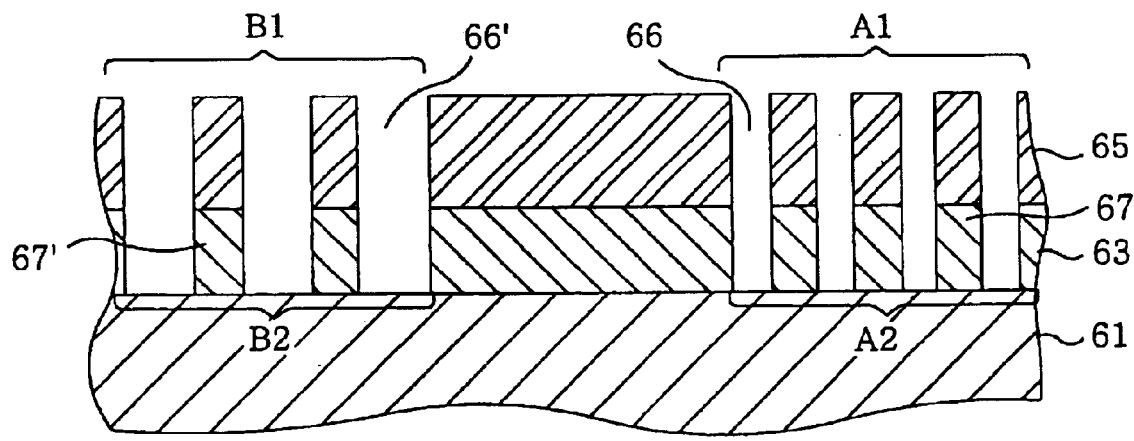

After plasma etching, the photoresist layer 65 was removed, and the line widths of wirings 67 and 67' respectively formed at the compact and loose wiring portion A2 and B2 of the etching target layer 63 (see, e.g., FIGS. 2B and 3) were measured. Based on the measured values, a CD (Critical Dimension) shift and a standard deviation $\sigma$ were calculated. The smaller the $\sigma$, the smaller the distribution range and the line width variation. The bigger the $\sigma$, the greater the distribution range and the line width variation. Accordingly, the line width variation was estimated based on the size of $3\sigma$ since 99.7% of the measured values are included in a range of $m \pm 3\sigma$, m being an average, if the measured values are of normal distribution.

Figure 4:
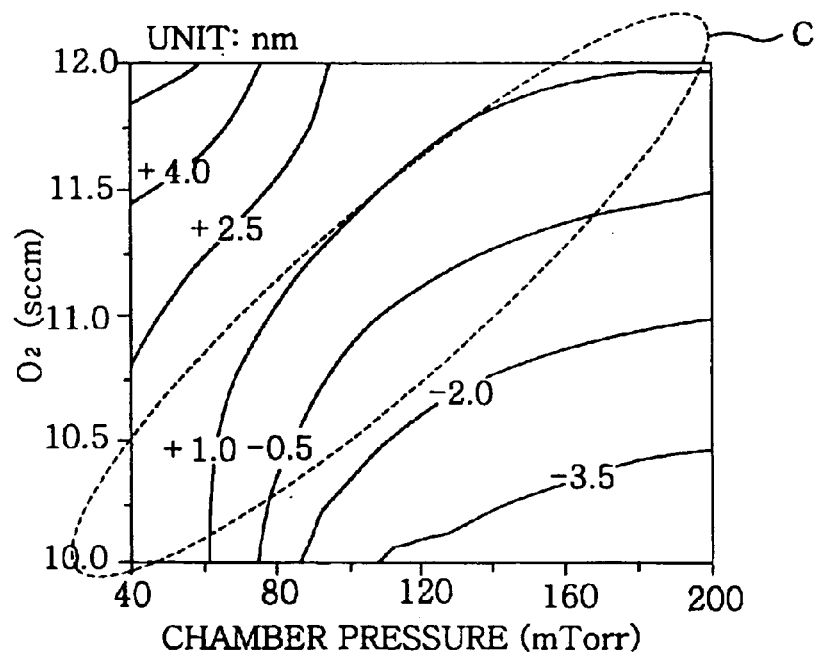
FIG. 4 offers a graph showing a difference between an in-surface line width variation of a compact wiring portion and that of a loose wiring portion formed in an etching target layer as a function of an $O_2$ flow rate and a chamber pressure.

FIG. 4 is a graph showing a difference between in-surface line width variation of the wiring 67 at the compact wiring portion A2 and that of the wiring 67' at the loose wiring portion B2 formed in the etching target layer 63 by plasma etching as a function of an $O_2$ flow rate and a chamber pressure. Numerical values having a unit of nm assigned to different curves of the graph in FIG. 4 were obtained by subtracting $3\sigma$ of the measured line width of the wiring 67' at the loose wiring portion B2 from that of the wiring 67 at the compact wiring portion A2. Accordingly, a value being close to zero represents that the line width variations of the wirings 67 and 67' at the compact and the loose wiring portion A2 and B2 are almost equal. On the contrary, if a value has a large absolute value, there is a significant difference between the line width variations of the wirings 67 and 67' at the compact and the loose wiring portion A2 and B2.

The part of the graph having value close to 0 nm, i.e., the part having value between about −0.5 and about +1 nm, included in the dotted oval C in FIG. 4, have the minimal difference between the line width variations of the wiring 67 at the compact wiring portion A2 and the wiring 67' at the loose wiring portion B2.

Figure 5A:
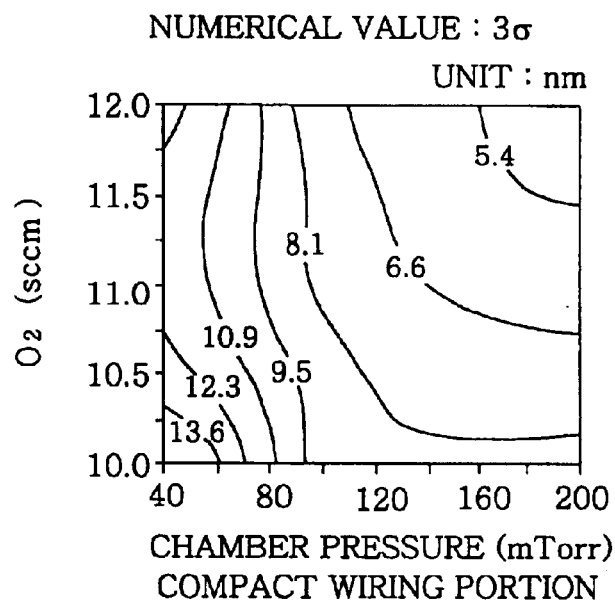
FIGS. 5A and 5B depict in-surface line width variations of wirings formed in an etching target layer as a function of $O_2$ flow rate and a chamber pressure.
Figure 5B:
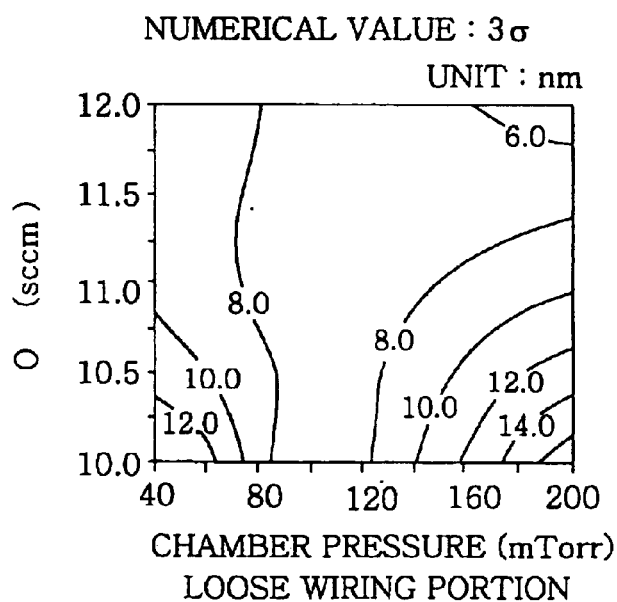

FIG. 5A is a graph showing the in-surface line width variation of the wiring 67 at the compact wiring portion A2 of the etching target layer 63 of the processed object W, and FIG. 5B is a graph showing the in-surface line width variation of the wiring 67' at the loose wiring portion B2 thereof. The values shown in the graphs in FIGS. 5A and 5B are $3\sigma$, and the unit thereof is "nm". From FIGS. 5A and 5B, it is be seen that with process conditions corresponding to the upper right corner of the graph (i.e., high $O_2$ flow rate and high chamber pressure), the in-surface variations (e.g., the difference between the line width of the wiring 67 at a cell located at a center of the object W and that of the wiring 67 at a cell located at a periphery portion of the object W) are minimized at both of the compact wiring portion A2 and the loose wiring portion B2. The in-surface variation less than or equal to 10 nm is acceptable in a manufacturing process.

As can be seen from FIGS. 5A and 5B, process conditions correspond to the lower left corner of the graph (i.e., low $O_2$ flow rate and low chamber pressure) yield large in-surface variations of the wiring 67 and the wiring 67'. Therefore, such conditions (i.e., conditions at the lower left corner) in the dotted oval in FIG. 4 should preferably be avoided, even though the difference between the in-surface variations can be small with those conditions. In conclusion, the chamber pressure ranging from about 10 Pa to about 27 Pa and the $O_2$ flow rate ranging from about 11 sccm to about 20 sccm are preferable.

Figure 6A:
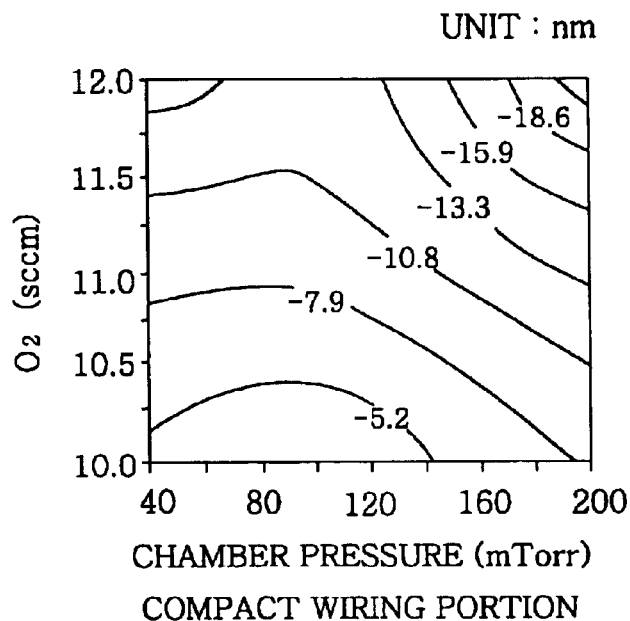
FIGS. 6A and 6B present differences between line widths of wirings formed in the etching target layer and those of wirings of a photoresist layer as a function of $O_2$ flow rate and a chamber pressure.
Figure 6B:
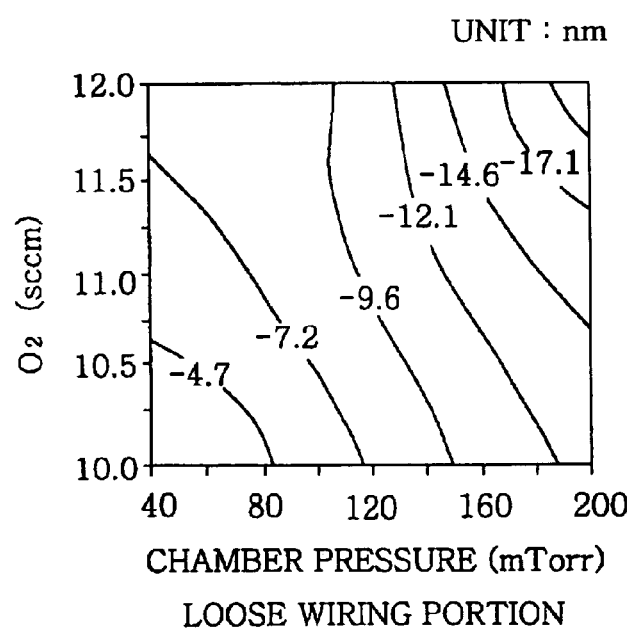

FIG. 6A is a graph showing a distribution of values obtained by subtracting the line width at the dense pattern portion A1 of the photoresist layer 65 (i.e., a distance between openings 66 before etching the etching target layer 63) from the line width of the wiring 67 at the compact wiring portion A2. And FIG. 6B is a graph showing a distribution of values obtained by subtracting the line width at the sparse pattern portion B1 of the photoresist layer 65 (i.e., a distance between openings 66' before etching the etching target layer 63) from the line width of the wiring 67' at the loose wiring portion B2. The negative values in the graphs show that the wirings 67 and 67' were trimmed more minutely than the corresponding line widths of the photoresist layer 65. The line widths of the wirings 67 and 67' become finer as the O₂ flow rate and the chamber pressure become high. Accordingly, by controlling these parameters (i.e., the O₂ flow rate and the chamber pressure), a trimming condition can be changed. In this way, the line widths of the wirings 67, 67' can be tailored to be finer in a controlled manner.

Figure 7:
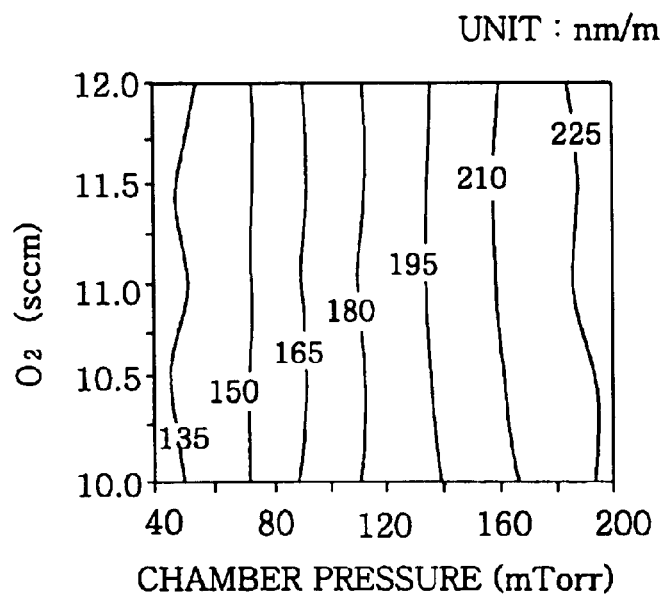
FIG. 7 represents a graph showing an etching rate of the etching target layer as a function of $O_2$ flow rate and a chamber pressure.
Figure 8:
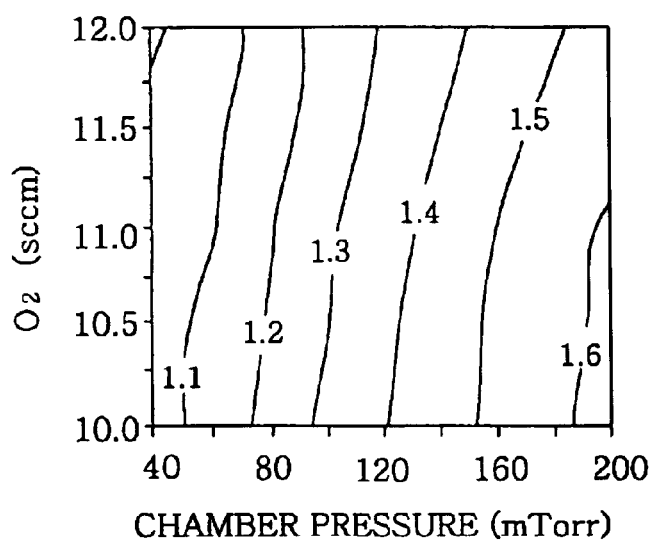
FIG. 8 provides a graph showing a selectivity with respect to a photoresist layer as a function of $O_2$ flow rate and a chamber pressure.

FIG. 7 is a graph showing an effect of the O₂ flow rate and the chamber pressure on the etching rate of the etching target layer 63. And FIG. 8 is a graph showing an effect of the O₂ flow rate and the chamber pressure on the selectivity with respect to the photoresist layer 65. As can be seen from FIGS. 7 and 8, the etching rate and the selectivity are both low when the chamber pressure is low.

Table 1 shows etching conditions and processing results for cases where the etching gas includes $C_2H_2F_4$ (Example 1 and Example 2) and $CHF_3$ (Comparative Example). As shown in Table. 1, the examples 1 and 2 were processed under the above-described processing conditions. In the comparative example, as shown in FIG. 1, the high frequency power supplied to the susceptor 8 was 500 W, the inner pressure of the chamber 2 during etching was about 27 Pa (200 mTorr), and flow rates of $CF_4$, $CHF_3$, Ar and $O_2$ in the etching gas was 50 sccm, 20 sccm, 400 sccm, and 10 sccm.

As shown in Table 1, although the comparative example and the example 1 have almost equal line widths (CD shift), 3σ of the example 1 is about one half of that of the comparative example, which shows the line width variation is improved in the example 1. Further, although the line width is narrowed by trimming in the example 2, 3σ thereof remains almost the same as that of the example 1, which shows that the trimming process was carried out while reducing or restraining the line width variation to be small.

The present invention can be preferably employed in the manufacturing process of semiconductor devices and a FPD (Flat Panel Display).

While the invention has been shown and described with respect to the preferred embodiments, it will be understood by those skilled in the art that various changes and modifications may be made without departing from the spirit and scope of the invention as defined in the following claims.

What is claimed is:

1. A plasma etching method comprising the step of:
plasma etching an SiN layer through a mask layer to form a first wiring portion and a second wiring portion, the first and the second wiring portions having different wiring densities in the etched SiN layer, the mask having two pattern portions respectively corresponding to the first and the second wiring portions,
wherein the plasma etching step is carried out by using an etching gas including fluorocarbon and $C_2H_2F_4$ to restrain a line width variation between the first and the second wiring portions.

2. The plasma etching method of claim 1, wherein the etching gas further includes $O_2$.

3. The plasma etching method of claim 2, wherein an ambient pressure of the plasma etching step ranges from about 10 Pa to about 27 Pa.

4. The plasma etching method of claim 3, wherein said $O_2$ is introduced at a flow rate ranging from about 11 sccm to about 20 sccm.

5. The plasma etching method of claim 1, wherein the etching gas further includes Ar.

6. The plasma etching method of claim 1, wherein the fluorocarbon is $CF_4$.

7. A plasma etching method comprising the step of:
plasma etching an $SiO_2$ layer through a mask layer to form a first wiring portion and a second wiring portion having different wiring densities in the etched $SiO_2$ layer, the mask having two pattern portions respectively corresponding to the first and the second wiring portions,

TABLE 1

|  |  | Example 1 | | Example 2 | | Comparative Example | |
| --- | --- | --- | --- | --- | --- | --- | --- |
|  |  | Compact wiring portion | Loose wiring portion | Compact wiring portion | Loose wiring portion | Compact wiring portion | Loose wiring portion |
| Condition | Power supplied to susceptor (W) | 500 | | 500 | | 500 | |
|  | $CF_4$ (sccm) | 65 | | 65 | | 50 | |
|  | $CHF_3$ (sccm) | — | | — | | 20 | |
|  | $C_2H_2F_4$ (sccm) | 5 | | 5 | | — | |
|  | Ar (sccm) | 400 | | 400 | | 400 | |
|  | $O_2$ (sccm) | 11 | | 12 | | 10 | |
|  | Chamber pressure (Pa) | 13.3 | | 26.7 | | 26.7 | |
| Result | CD shift (nm) | −9.0 | −8.6 | −21.9 | −23.0 | −11.9 | −10.6 |
|  | 3σ (nm) | 5.7 | 4.5 | 4.2 | 4.8 | 10.5 | 9.6 | wherein the plasma etching step is carried out by using an etching gas including fluorocarbon, $C_2H_2F_4$ and $O_2$ to restrain line width variations between the first and the second wiring portions.

8. A plasma etching method comprising the step of:

plasma etching an $SiO_2$ layer or an SiN layer through a mask layer by using an etching gas including fluorocarbon, $C_2H_2F_4$ and $O_2$ to form a wiring in the $SiO_2$ layer or the SiN layer, the mask being formed of an organic material and including a mask pattern corresponding to the wiring, wherein a line width of the wiring is smaller than that of the mask pattern and a difference therebetween is determined by an ambient pressure or a flow rate of said $O_2$ in the etching gas during the plasma etching step.

9. The plasma etching method of claim 8, wherein the wiring of the $SiO_2$ layer or the SiN layer includes a first wiring portion and a second wiring portion having different wiring densities, the mask pattern of the mask layer includes two pattern portions respectively corresponding to the first and the second wiring portions, and the line width variation between the first and the second wiring portions is suppressed.

10. The plasma etching method of claim 8, wherein the line width of the wiring becomes further smaller by increasing either the ambient pressure or the $O_2$ flow rate.

11. The plasma etching method of claim 8, wherein the line width of the wiring becomes further smaller by increasing both the ambient pressure and the $O_2$ flow rate.

12. The plasma etching method of claim 8, wherein the ambient pressure during the plasma etching step of the SiN layer ranges from about 10 Pa to about 27 Pa.

13. The plasma etching method of claim 12, wherein the $O_2$ flow rate ranges from about 10 sccm to about 20 sccm.

14. The plasma etching method of claim 8, wherein the $SiO_2$ layer or the SiN layer is used as a hard mask layer for etching an underlying layer thereof.

* * * * *